(12) United States Patent
Chang et al.

(10) Patent No.: US 7,888,152 B2
(45) Date of Patent: Feb. 15, 2011

(54) METHOD OF FORMING LATERALLY DISTRIBUTED LEDS

(75) Inventors: Chun-Yen Chang, 1001 Ta-Hsueh Rd., Hsinchu (TW) 300; Tsung-Hsi Yang, Hsinchu (TW); Yen-Chen Chen, Tainan (TW)

(73) Assignee: Chun-Yen Chang, Hsinchu County (TW)

( * ) Notice: Subject to any disclaimer, the term of this patent is extended or adjusted under 35 U.S.C. 154(b) by 183 days.

(21) Appl. No.: 12/366,609

(22) Filed: Feb. 5, 2009

(65) Prior Publication Data

US 2010/0197060 A1    Aug. 5, 2010

(51) Int. Cl.
*H01L 21/00* (2006.01)
(52) U.S. Cl. .................................... 438/35; 257/E21.09
(58) Field of Classification Search ...................... 438/35
See application file for complete search history.

(56) References Cited

U.S. PATENT DOCUMENTS 6,242,761 B1 *   6/2001   Fujimoto et al. ............... 257/94
6,319,742 B1 *  11/2001   Hayashi et al. ................ 438/46
6,677,617 B2 *   1/2004   Tominaga ....................... 257/88
7,279,350 B2 * 10/2007   Wu et al. ....................... 438/35

* cited by examiner

*Primary Examiner*—Chandra Chaudhari
(74) *Attorney, Agent, or Firm*—Stout, Uxa, Buyan & Mullins, LLP

(57) ABSTRACT

A method of forming laterally distributed light emitting diodes (LEDs) is disclosed. A first buffer layer with a first type of conductivity is formed on a semiconductor substrate, and a dielectric layer is formed on the first buffer layer. The dielectric layer is patterned to form a first patterned space therein, followed by forming a first active layer in the first patterned space. The dielectric layer is then patterned to form a second patterned space therein, followed by forming a second active layer in the second patterned space. Second buffer layers with a second type of conductivity are then formed on the first active layer and the second active layer. Finally, electrodes are formed on the second buffer layers and on the first buffer layer.

20 Claims, 5 Drawing Sheets

US 7,888,152 B2

METHOD OF FORMING LATERALLY DISTRIBUTED LEDS

BACKGROUND OF THE INVENTION

1. Field of the Invention

The present invention generally relates to a light emitting diode (LED), and more particularly to a method of forming laterally distributed red, green and blue (RGB) LEDs on a chip.

2. Description of the Prior Art

Light emitting diodes (LEDs), particularly white LEDs, have been increasingly used as backlighting for liquid crystal displays (LCDs) of mobile phones and notebook computers. Moreover, red, green and blue (RGB) LEDs are usually color mixed to obtain better lighting characteristics.

However, the performance and illuminance efficiency of mixing state-of-the-art RGB LEDs are low and the cost of packaging to combine RGB LEDs is high. For example, with respect to a conventional technique, discrete LED components are assembled on a package as shown in FIG. 1A. In an improved Chip-on-Board (COB) technique, as shown in FIG. 1B, the RGB LED chips are directly mounted on the package, rather than a more traditional assembling of the discrete LED components. Therefore, the height of the COB package (FIG. 1B) is smaller than the height of the discretely assembled package. Further, the minimum interval between adjacent LEDs using the COB technique may accordingly be decreased to reach about 2 mm, while the minimum interval between adjacent LEDs using discrete assembling techniques may be as large as 5 mm. Nevertheless, the 2 mm interval using the COB technique is still too large to arrive at high performance and illuminance efficiency without additionally, and thus costly, using a reflector and a light guide plate (LGP).

A conventional structure and method of fabricating vertically stacked LEDs on a chip is disclosed, for example, in "Multi-color Light Emitting Diode Using Polarization-induced tunnel Junctions," Phys. Stat. Sol. (c) 4, No. 7, 2830-2833 (2007), by Michael J. Grundmann et al. In that publication, vertically stacked LEDs are provided with electroluminescence properties that often change disadvantageously with injection current.

Another prior art structure and method of fabricating laterally distributed LEDs on a chip is disclosed, for example, in "Phosphor-free White Light-emitting Diode with Laterally Distributed Multiple Quantum Wells," Applied Physics Letters 92, 091110 (2008), by Il-Kyu Park et al. In the disclosed process, the etching of the multiple quantum wells will incur surface damage, which results in low illuminance efficiency.

For the reason that conventional LEDs could not be effectively combined to obtain better lighting characteristics, a need has arisen to propose a novel scheme for fabricating LEDs with stable output efficiency, simple packaging, high color mixing efficiency and reduced chip area.

SUMMARY OF THE INVENTION

In view of the foregoing, it is an object of the present invention to provide a method of forming laterally distributed red, green and blue (RGB) LEDs on the same chip, with stable output efficiency, simple packaging, high color mixing efficiency and reduced chip area.

According to one embodiment, a first buffer layer with a first type of conductivity (e.g., n-type) is formed on a semiconductor substrate, and a dielectric layer is formed on the first buffer layer. The dielectric layer is patterned to form a first patterned space therein, followed by forming a first active layer (e.g., MQWs) in the first patterned space. The dielectric layer is then patterned to form a second patterned space therein, followed by forming a second active layer (e.g., MQWs) in the second patterned space. In an embodiment, a third active layer (e.g., MQWs) may be further formed in the dielectric layer. Second buffer layers with a second type of conductivity (e.g., p-type) are then formed on the first active layer and the second active layer (and the third active layer). Finally, electrodes are formed on the second buffer layers and on the first buffer layer.

DETAILED DESCRIPTION OF THE INVENTION

FIG. 2A through FIG. 2J illustrate fabrication process and corresponding cross-sectional structures in sequence of laterally distributed red, green and blue (RGB) light emitting diodes (LEDs) on a chip according to one embodiment of the present invention. The LEDs may be applied but are not limited to solid-state lighting or display backlighting contexts. While the RGB LEDs are formed in the exemplary embodiment, it is appreciated that it is not necessary to form all of the RGB LEDs on the chip. For example, blue LED and green LED are enough to work as a white LED. Further, the color of some of the RGB LEDs may be altered. For example, the red LED may be replaced by a yellow LED in another embodiment. Moreover, while the blue LED, the green LED and the red LED are fabricated in sequence in the exemplary embodiment, it is appreciated that the order of forming the RGB LEDs may be altered. It is also noted that the laterally distributed RGB LEDs formed according to the illustrated embodiment may be utilized as a whole to function as a white LED, or may be utilized individually.

Figure 1A:
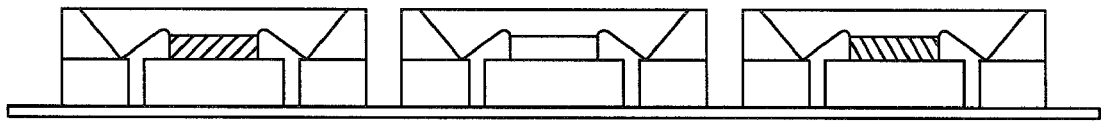
FIG. 1A shows a conventional technique, in which discrete LED components are assembled on a package.
Figure 1B:
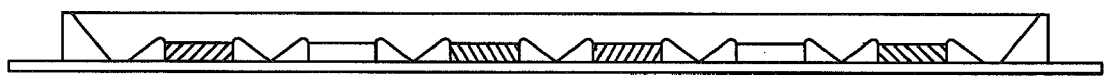
FIG. 1B shows a conventional Chip-on-Board (COB) technique, in which LED chips are directly mounted on the package.
Figure 2A:
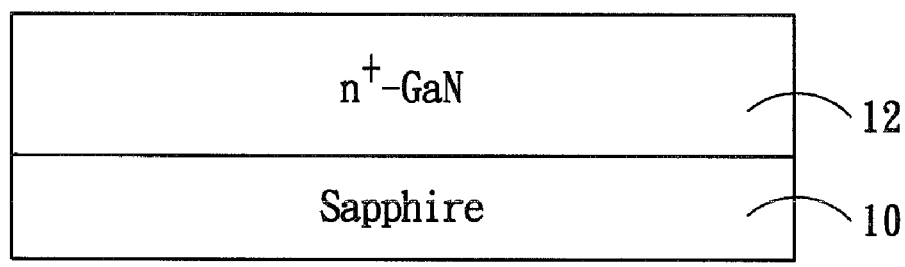
FIG. 2A through FIG. 2J illustrate fabrication process and cross-sectional structures in sequence of laterally distributed red, green and blue (RGB) light emitting diodes (LEDs) on a chip according to one embodiment of the present invention.

Referring to FIG. 2A, an n-type buffer layer 12, such as an $n^+$-GaN layer, is grown on a substrate 10, for example, by metal organic chemical vapor deposition (MOCVD). The $n^+$-GaN buffer layer 12 may be in the range of about 2.0-6.0 µm in thickness, and be preferably about 6.0 µm in thickness in the embodiment. The growing temperature may be in the range of about 950-1100° C., and be preferably about 1100° C. in the embodiment. The substrate 10 preferably includes sapphire, but may in general include semiconductor material, such as AlN, ZnO, SiC, BP, CaAs, CaP, Si, LiAlO$_2$ or LaAlO$_3$.

Figure 2B:
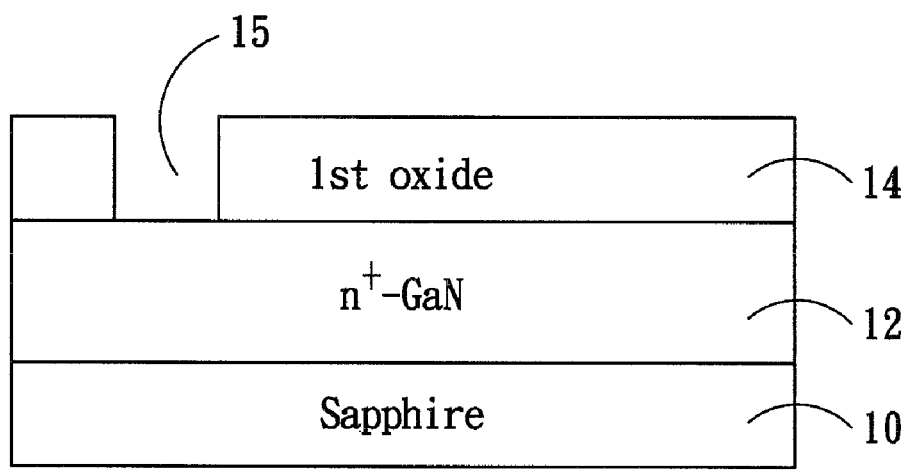

Subsequently, in FIG. 2B, a first dielectric layer 14, such as silicon oxide (SiO$_2$) layer, is deposited on the $n^+$-GaN buffer layer 12, for example, by plasma-enhanced chemical vapor deposition (PECVD). In the embodiment, the first SiO$_2$ layer 14 preferably has a thickness of about 0.3 µm, and in general has a thickness of about 0.2-0.5 µm. The first SiO$_2$ layer 14 is then patterned using photolithographic process, followed by removing the exposed area 15 until the $n^+$-GaN buffer layer 12 is exposed, for example, by wet etching with HF or buffer oxide etch (BOE) etchant.

Figure 2C:
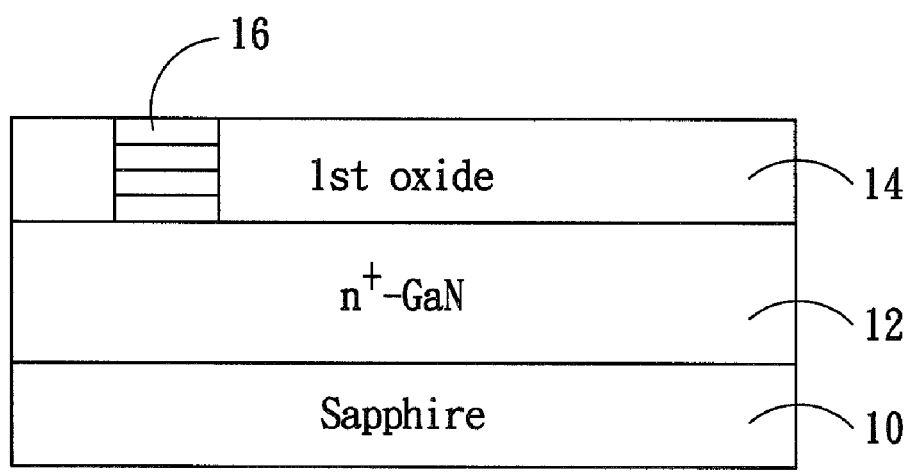

In FIG. 2C, the patterned first SiO$_2$ layer 14 is used as a mask for selectively growing one or more pairs of blue multi-quantum wells (MQWs) 16 on the patterned or removed space 15. In the embodiment, 10 pairs of blue MQWs are preferably grown. The blue MQWs 16, which act as an active layer as a whole, are selectively grown preferably at a high temperature of about 780° C., and in general in a range of about 750-800° C. In the embodiment, each pair of MQWs includes nitride based material $In_xGa_{1-x}N/GaN$ (0<x<1).

Figure 2D:
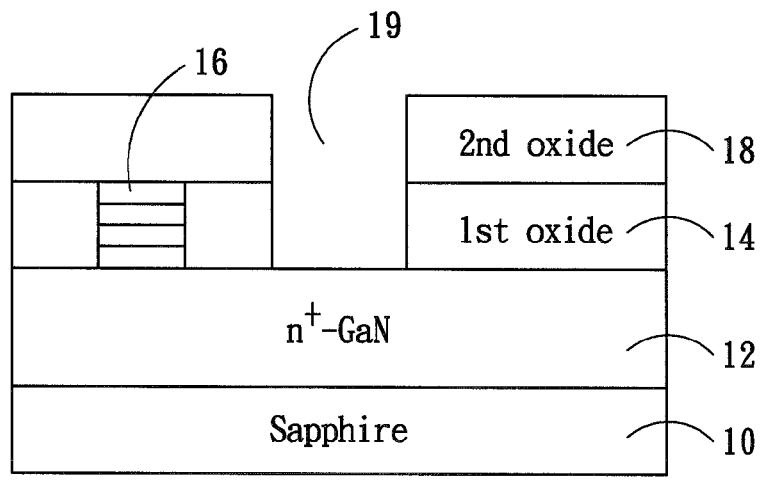

Afterwards, as shown in FIG. 2D, a second dielectric layer 18, such as silicon oxide ($SiO_2$) layer, is deposited on the first $SiO_2$ layer 14 and the blue MQWs 16, for example, by plasma-enhanced chemical vapor deposition (PECVD). In the embodiment, the second $SiO_2$ layer 18 preferably has a thickness of about 0.1 μm, and generally of about 0.2-0.5 μm, which is thinner than the first $SiO_2$ layer 14. The second $SiO_2$ layer 18 is then patterned using photolithographic process, followed by removing the exposed area 19 until the $n^+$-GaN buffer layer 12 is exposed, for example, by wet etching with HF or buffer oxide etch (BOE) etchant.

Figure 2E:
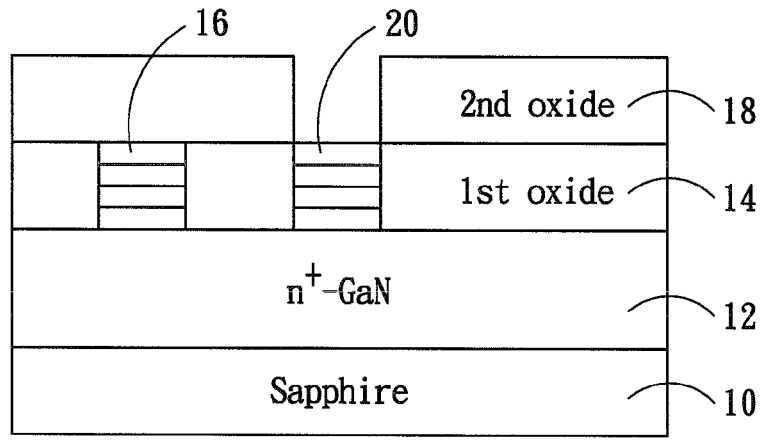

In FIG. 2E, the patterned second $SiO_2$ layer 18 is used as a mask for selective growing one or more pairs of green MQWs 20 on the patterned or removed space 19. In the embodiment, 10 pairs of green MQWs are preferably grown. The green MQWs are selectively grown preferably at a middle temperature of about 750° C., and generally in a range of about 700-760° C. As the amount of indium (In) contained in the green MQWs is higher than that in the blue MQWs, the temperature of growing the green MQWs is necessarily lower than the temperature of growing the blue MQWs in FIG. 2C. In the embodiment, each pair of MQWs includes nitride based material $In_xGa_{1-x}N/GaN$ (0<x<1).

Figure 2F:
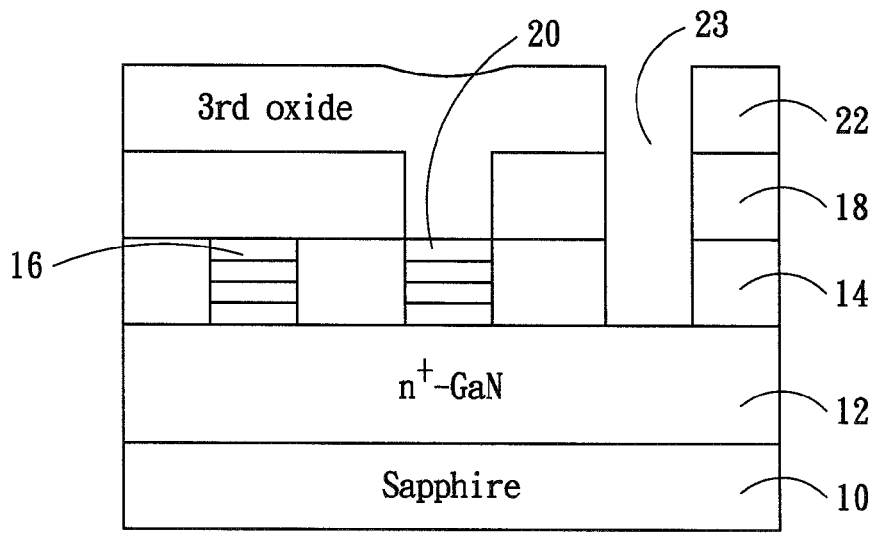

Afterwards, as shown in FIG. 2F, a third dielectric layer 22, such as silicon oxide ($SiO_2$) layer, is deposited on the second $SiO_2$ layer 18 and the green MQWs 20, for example, by plasma-enhanced chemical vapor deposition (PECVD). In the embodiment, the third $SiO_2$ layer 22 preferably has a thickness of about 0.1 μm, and generally in a range of about 0.2-0.5 μm, which is as thick as the second $SiO_2$ layer 18 but thinner than the first $SiO_2$ layer 14. The third $SiO_2$ layer 22 is then patterned using photolithographic process, followed by removing the exposed area 23 until the $n^+$-GaN buffer layer 12 is exposed, for example, by wet etching with HF or buffer oxide etch (BOE) etchant. In an alternative embodiment, the second $SiO_2$ layer 18 may be removed before forming the third $SiO_2$ layer 22.

Figure 2G:
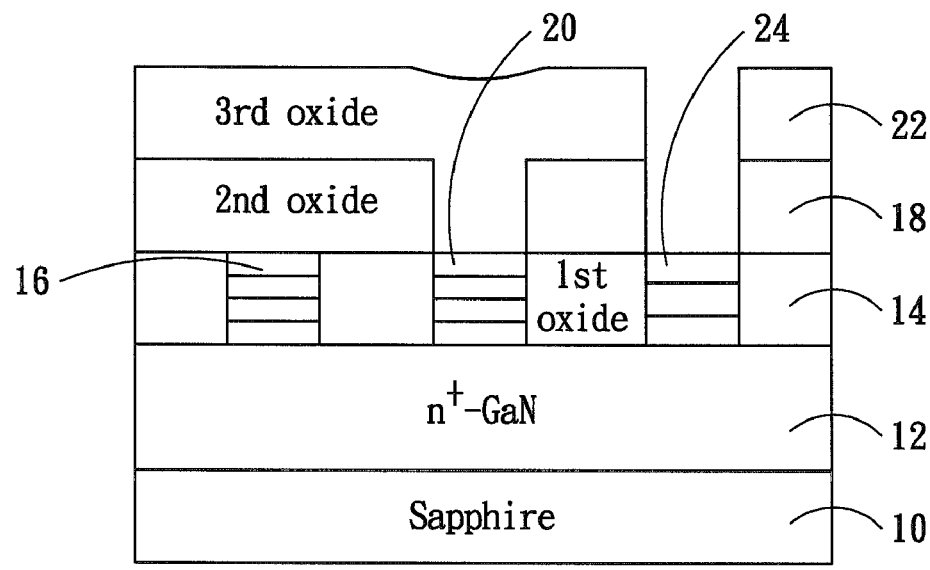

In FIG. 2G, the patterned third $SiO_2$ layer 22 is used as a mask for selective growing one or more pairs of red MQWs 24 on the patterned or removed space 23. In the embodiment, 10 pairs of red MQWs are preferably grown. The red MQWs are selectively grown preferably at a low temperature of about 650° C., and generally of about 550-650° C. As the amount of indium (In) contained in the red MQWs is higher than that in the green MQWs, the temperature of growing the red MQWs is necessarily lower than the temperature of growing the green MQWs in FIG. 2E. In the embodiment, each pair of MQWs includes nitride based material $In_xGa_{1-x}N/GaN$ (0<x<1). In an alternative embodiment, each pair of MQWs includes phosphorus based material $In_xGa_{1-x}P/In_y(Al_xGa_{1-x})P$ (0<x<1 and 0<y<1).

Figure 2H:
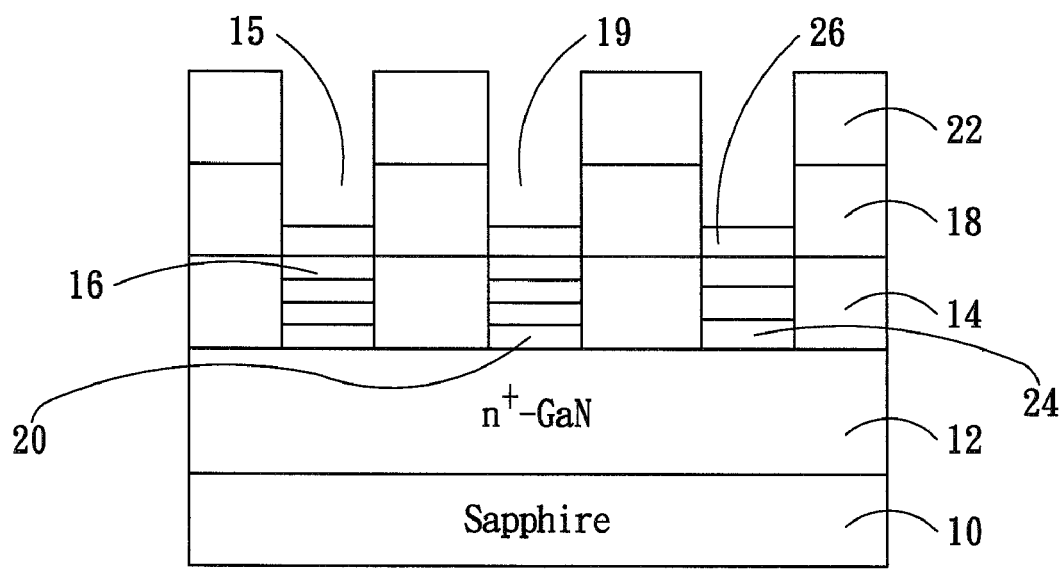

Subsequently, as shown in FIG. 2H, the third $SiO_2$ layer 22 is patterned using photolithographic process, followed by removing the exposed area 15 over the blue MQWs 16 and the exposed area 19 over the green MQWs 20. Using the patterned third $SiO_2$ layer 22 as a mask, a p-type buffer layer 26, such as $p^+$-GaN layer, is grown on the blue MQWs 16, the green MQWs 20 and the red MQWs 24, for example, by metal organic chemical vapor deposition (MOCVD). The $p^+$-GaN buffer layer 26 is preferably about 0.2 μm in thickness, and may be about 0.1-0.25 μm in thickness. The growing temperature is preferably about 900° C. in the embodiment, and generally about 900-1000° C.

Figure 2I:
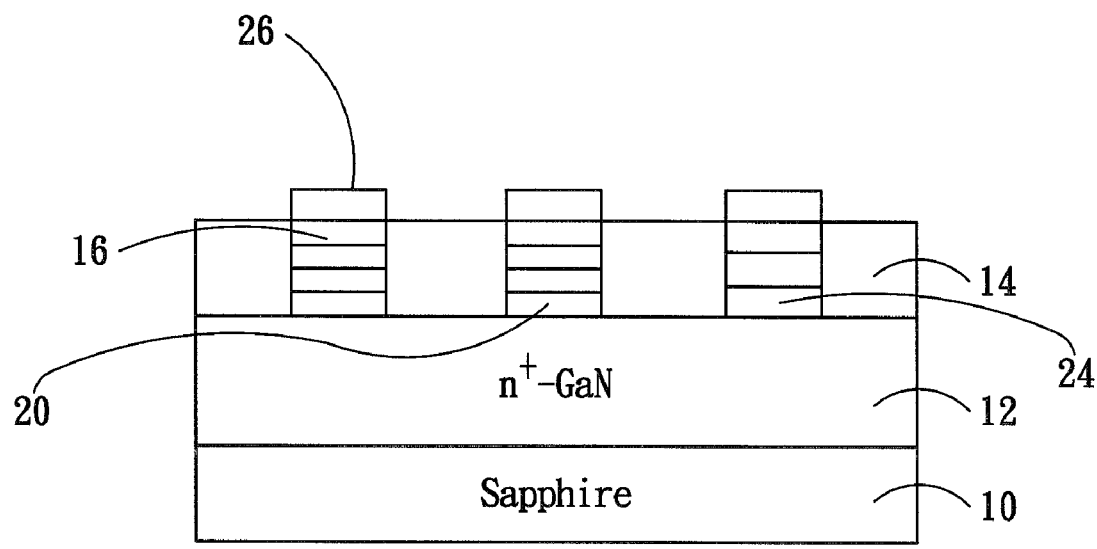
Figure 2J:
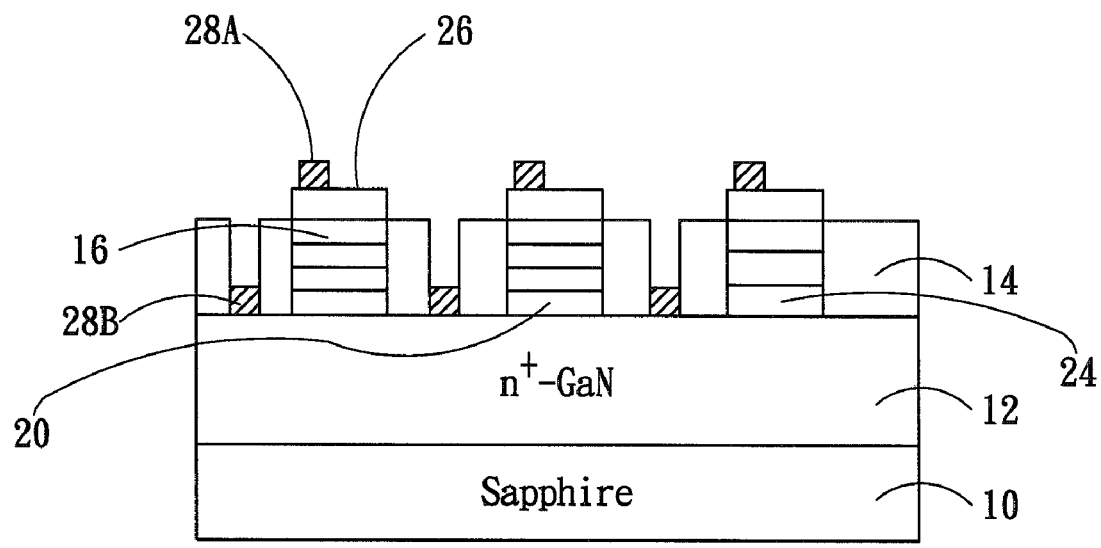

Referring to FIG. 2I, the third $SiO_2$ layer 22 and the second $SiO_2$ layer 18 are removed, for example, by wet etching with HF or buffer oxide etch (BOE) etchant. Finally, as shown in FIG. 2J, portions of the first $SiO_2$ layer 14 are removed until $n^+$-GaN buffer layer 12 is exposed, for example, by wet etching with HF etchant. Subsequently, n-type and p-type conductive electrodes (or Ohmic contacts) 28A and 28B are formed on the $n^+$-GaN buffer layer 12 and the $p^+$-GaN buffer layer 26, respectively. The conductive electrodes 28A and 28B may, for example, contain Ti—Al and Ni—/Au layers. Accordingly, the laterally distributed red, green and blue (RGB) LEDs are thus formed on the same chip as shown in the cross sectional view in FIG. 2J.

According to the embodiment, the laterally distributed red, green and blue (RGB) LEDs formed on the same chip may be combined to emit white light. In other words, the RGB LEDs work to function as a white LED, which is commonly called the multi-chip white LED. The color mixing using the RGB LEDs provides a broader lighting spectrum and better color characteristics on the LCD than the conventional cold cathode fluorescent lamp (CCFL). The white LED is phosphor-free with stable output efficiency and simple packaging. As the interval between adjacent RGB LEDs may be scaled down to tens of micrometers (μm) or less, the color mixing efficiency may become high, and the chip area may be substantially reduced.

Although specific embodiments have been illustrated and described, it will be appreciated by those skilled in the art that various modifications may be made without departing from the scope of the present invention, which is intended to be limited solely by the appended claims.

What is claimed is:

1. A method of forming laterally distributed light emitting diodes (LEDs), comprising:
   providing a semiconductor substrate;
   forming a first buffer layer with a first type of conductivity on the semiconductor substrate;
   forming a dielectric layer on the first buffer layer;
   patterning to form a first patterned space within the dielectric layer;
   forming a first active layer in the first patterned space of the dielectric layer;
   patterning to form a second patterned space within the dielectric layer;
   forming a second active layer in the second patterned space of the dielectric layer, the second active layer being capable of emitting color different from the first active layer;
   forming second buffer layers with a second type of conductivity on the first active layer and the second active layer; and
   forming electrodes on the second buffer layers and on the first buffer layer.

2. The method of claim 1, wherein the semiconductor substrate includes sapphire.

3. The method of claim 1, wherein the first type of conductivity is n-type, and the second type of conductivity is p-type.

4. The method of claim 1, wherein the first or the second buffer layer comprises GaN.

5. The method of claim 1, wherein the dielectric layer comprises $SiO_2$.

6. The method of claim 1, wherein the first or the second active layer comprises one or more pairs of multiple quantum wells (MQWs).

7. The method of claim 6, wherein the MQWs comprise nitride based material $In_xGa_{1-x}N/GaN$ ($0<x<1$).

8. The method of claim 6, wherein amount of the indium (In) contained in the second active layer is higher than amount of the In contained in the first active layer.

9. The method of claim 8, wherein temperature of forming the second active layer is lower than temperature of forming the first active layer.

10. The method of claim 1, further comprising:
patterning to form a third patterned space within the dielectric layer; and
forming a third active layer in the third patterned space, the third active layer being capable of emitting color different from the first active layer and the second active layer.

11. A method of forming laterally distributed LEDs, comprising:
providing a semiconductor substrate;
forming a first buffer layer with a first type of conductivity on the semiconductor substrate;
forming a first dielectric layer on the first buffer layer;
patterning to remove a portion of the first dielectric layer, thereby forming a first patterned space within the first dielectric layer;
forming first multiple quantum wells (MQWs) in the first patterned space;
forming a second dielectric layer on the first dielectric layer;
patterning to remove a portion of the second and the first dielectric layers, thereby forming a second patterned space within the first dielectric layer;
forming second MQWs in the second patterned space, the second MQWs being capable of emitting color different from the first MQWs;
forming a third dielectric layer on the second or the first dielectric layer;
patterning to remove a portion of the third, the second and the first dielectric layers, thereby forming a third patterned space within the first dielectric layer;
forming third MQWs in the third patterned space, the third MQWs being capable of emitting color different from the first and the second MQWs;
forming second buffer layers with a second type of conductivity on the first, the second and the third active layers; and
forming electrodes on the second buffer layers and on the first buffer layer.

12. The method of claim 11, wherein the semiconductor substrate includes sapphire.

13. The method of claim 11, wherein the first type of conductivity is n-type, and the second type of conductivity is p-type.

14. The method of claim 11, wherein the first or the second buffer layer comprises GaN.

15. The method of claim 11, wherein the first, the second or the third dielectric layer comprises $SiO_2$.

16. The method of claim 11, wherein the first, the second or the third MQWs comprise a pair or more pairs of multiple quantum wells.

17. The method of claim 11, wherein the first and the second MQWs comprise nitride based material $In_xGa_{1-x}N/GaN$ ($0<x<1$), and the third MQWs comprise nitride based material $In_xGa_{1-x}N/GaN$ ($0<x<1$) or phosphorus based material $In_xGa_{1-x}P/In_y(Al_xGa_{1-x})P$ ($0<x<1$ and $0<y<1$).

18. The method of claim 17, wherein amount of the indium (In) contained in the second MQWs is higher than amount of the In contained in the first MQWs, and amount of the In contained in the third MQWs is higher than amount of the In contained in the second MQWs.

19. The method of claim 18, wherein temperature of forming the second MQWs is lower than temperature of forming the first MQWs, and temperature of forming the third MQWs is lower than temperature of forming the second MQWs.

20. The method of claim 11, wherein the first MQWs emit blue light, the second MQWs emit green light, and the third MQWs emit red light.

* * * * *

UNITED STATES PATENT AND TRADEMARK OFFICE
CERTIFICATE OF CORRECTION

PATENT NO.         : 7,888,152 B2                                            Page 1 of 1
APPLICATION NO.    : 12/366609
DATED              : February 15, 2011
INVENTOR(S)        : Chun-Yen Chang, Tsung-Hsi Yang and Yen-Chen Chen It is certified that error appears in the above-identified patent and that said Letters Patent is hereby corrected as shown below:

Title Page, Item (73), Assignee:
The name of the Assignee on page 1 of the above-referenced patent has been corrected to read "Himax Display, Inc., Tainan (TW) and Chun-Yen Chang, Hsinchu County (TW)".

Signed and Sealed this
Twenty-ninth Day of March, 2011

David J. Kappos
*Director of the United States Patent and Trademark Office*